United States Patent
Hirashita et al.

(10) Patent No.: US 6,861,322 B2
(45) Date of Patent: Mar. 1, 2005

(54) METHOD OF MANUFACTURING A SEMICONDUCTOR DEVICE

(75) Inventors: Norio Hirashita, Higashi-yamato (JP); Takashi Ichimori, Tokyo (JP); Toshiyuki Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/154,825

(22) Filed: May 28, 2002

(65) Prior Publication Data

US 2002/0182784 A1 Dec. 5, 2002

(30) Foreign Application Priority Data

May 29, 2001 (JP) ........................................ 2001-160597

(51) Int. Cl.[7] ............................................ H01L 21/336

(52) U.S. Cl. ........................ 438/308; 438/194; 438/301

(58) Field of Search ................................. 438/149, 151, 438/164, 194, 301, 308

(56) References Cited

U.S. PATENT DOCUMENTS 5,807,770 A  *  9/1998  Mineji ......................... 438/151
6,391,692 B1 *  5/2002  Nakamura ................... 438/151

* cited by examiner

*Primary Examiner*—Asok Kumar Sarkar
(74) *Attorney, Agent, or Firm*—Volentine Francos & Whitt, PLLC (57) ABSTRACT

A heat treatment for diffusing impurity ions implanted into a silicon layer is performed at a heat treatment temperature which is less than an aggregation temperature of the silicon layer. A thermal aggregation of the silicon layer can be inhibited, thereby reducing a silicon deficiency of the silicon layer.

8 Claims, 7 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device which is formed in silicon layer located on an insulating layer, or on a silicon-on insulator (SOI) substrate.

The present application claims priority under 35 U.S.C. §119 to Japanese Patent Application No. 2001-160597, filed May 29, 2001, which is herein incorporated by reference in its entirely for all purposes.

2. Description of the Related Art

A field effect transistors are now typically formed on the SOI substrate (which is called an SOI-FET) instead of the more conventional bulk semiconductor substrate. The SOI-FET is formed in the thin silicon layer (the SOI layer) which is formed on the insulating layer of the SOI substrate. Since a junction capacitance is reduced by such a structure, the SOI-FET can operate at a high-speed. Particularly, a fully depleted SOI-FET formed in the SOI layer is known as a low-power device which has a small parasitic capacitance and a sub-threshold swing which is smaller than that of the conventional bulk semiconductor substrate. The fully depleted transistor has a depletion layer that expand to the bottom surfaces of a source region and a drain region, when a voltage is supplied to a gate electrode thereof. Since an expansion of the depleted layer of the fully depleted SOI-FET is defined by a thickness of the. SOI layer, a short channel effect can be inhibited. Thus, the thickness of the SOI layer is reduced to achieve the fully depleted operation of the SOI-FET.

Such a fully depleted SOI-FET having the source and drain regions in the SOI layer is constructed with an island shaped full isolation structure by performing an element isolation process, for example a local oxidation of silicon process (a LOCOS process). A region between the source and drain regions is called a body region. The body region is basically depleted when the fully depleted SOI-FET is operating.

Since a thickness of a channel depleted layer is determined in accordance with the thickness of the SOI layer, it is necessary reduce the thickness of the thinner SOI layer. When an extremely thin SOI layer (e.g. 10 nm) is formed, defects may arise due to a heat treatment process which is performed at a temperature of 900° C. or more. The heat treatment may cause a void to be opened in the SOI layer due to a thermal aggregation (also called a thermal agglomeration), and an upper surface of the insulating layer under the SOI layer might be exposed. Such a void generated by the thermal aggregation is disclosed in the magazine article of the lecture presentation of the 47$^{th}$ Applied Physics Association, pp. 884, 30p-YK-9, "Initial Stage of Thermal Agglomeration of an Ultrathin SOI", published in March, 2000. If a subsequent dry etching process forming a contact hole were performed on an SOI substrate having such a void, the void might extend through the insulating layer and be formed in the conductive substrate under the insulating layer. If such a void were formed at the edge of the SOI-FET, the drive current of the SOI-FET might be reduced, since a parasitic resistance of the source and drain regions would be increased so as to increase a resistance between the source and drain regions.

Further more, if a contact plug consisting of a metal material is formed in the contact hole, and a wiring layer connecting the contact plug is formed over the SOI substrate, since the contact plug is also formed in the void, the source and drain regions and the silicon substrate might be electrically shorted.

Figure 6A:
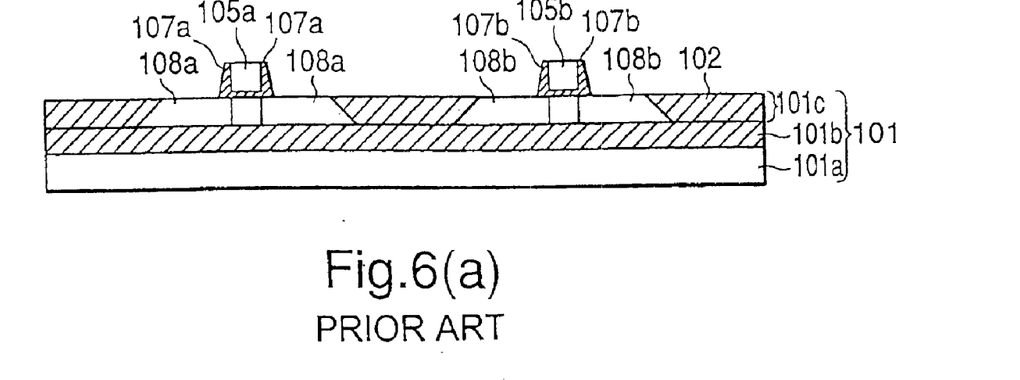
FIGS. 6(a) through 6(c) and 7(a) through 7(c) are cross-sectional views showing a conventional method of manufacturing a semiconductor device.

FIGS. 6(a) through 6(c) and 7(a) through 7(c) are cross-sectional views showing a conventional method of manufacturing a semiconductor device. An SOI substrate 101 includes a silicon substrate 101a, an embedded oxide layer 101b and a thin silicon layer 101c (an SOI layer 101c). As shown in FIG. 6(a), field oxide regions 102 and highly doped impurity regions 108a and 108b are formed in the SOI layer 101c, and gate electrodes 105a and 105b and side walls 107a and 107b are formed over the SOI substrate 101. The highly doped impurity layers 108a and 108b are formed by an implantation of impurity ions.

Figure 6B:
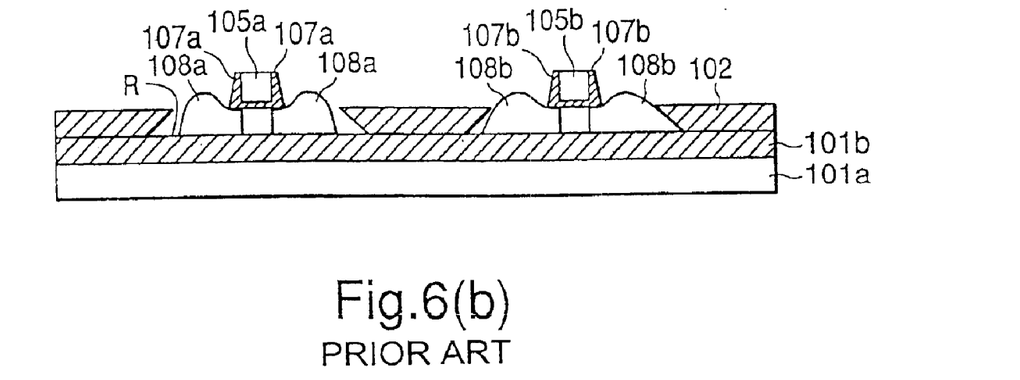

Then, a heat treatment is performed to activate the ion-implanted impurities at a high temperature. At this time, as shown in FIG. 6(b), the highly doped impurity layers 108a and 108b gradually aggregates since the temperature of the heat treatment is equal to or more than an aggregation temperature of the SOI layer 101c consisting of silicon. As such, when the SOI layer is ultra-thin, upper surfaces R of the embedded oxide layer 101b become partly exposed.

Figure 6C:
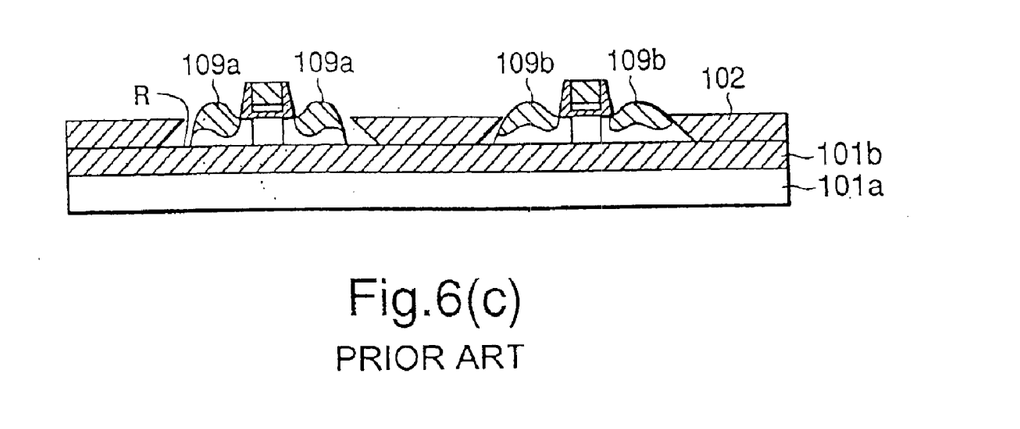

Next, as shown in FIG. 6(c), refractory metal silicide layers 109a and 109b are formed by a conventional silicide process.

Figure 7A:
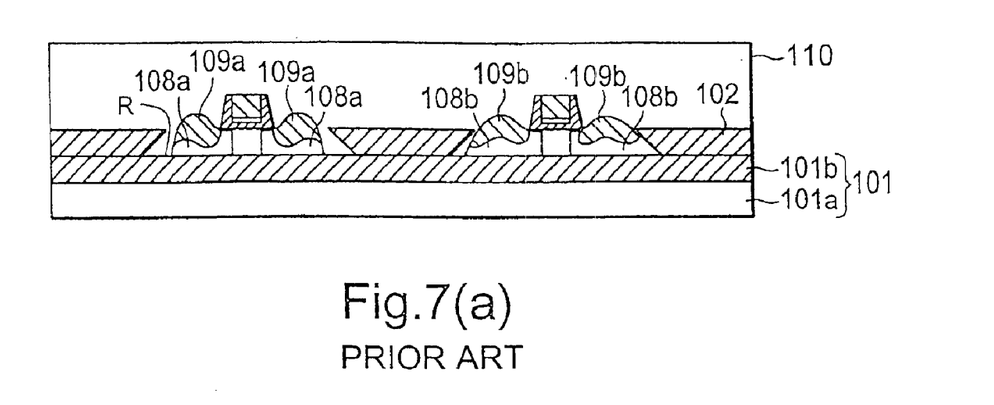

Next, as shown in FIG. 7(a), an interlayer insulating layer 110 is formed over the SOI substrate 101.

Figure 7B:
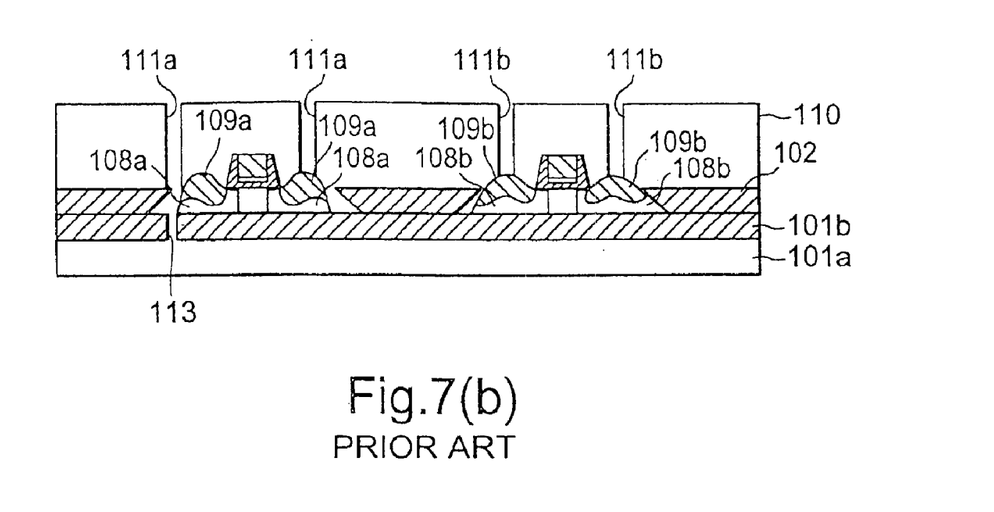

Next, as shown in FIG. 7(b), contact holes 111a and 111b are formed by an anisotropic etching, for example, a dry etching such as a reactive ion etching (RIE). At this time, since the embedded oxide layer 101b is partly exposed, a void 113 is formed extending through the embedded oxide layer 101b and reaching an upper surface of the silicon substrate 101a. As a result, since a parasitic resistance of the highly doped impurity layers 108a and 108b increases so as to increase a resistance between the highly doped impurity layers 108a and 108b, and the drive current of the SOI-FET is reduced.

Figure 7C:
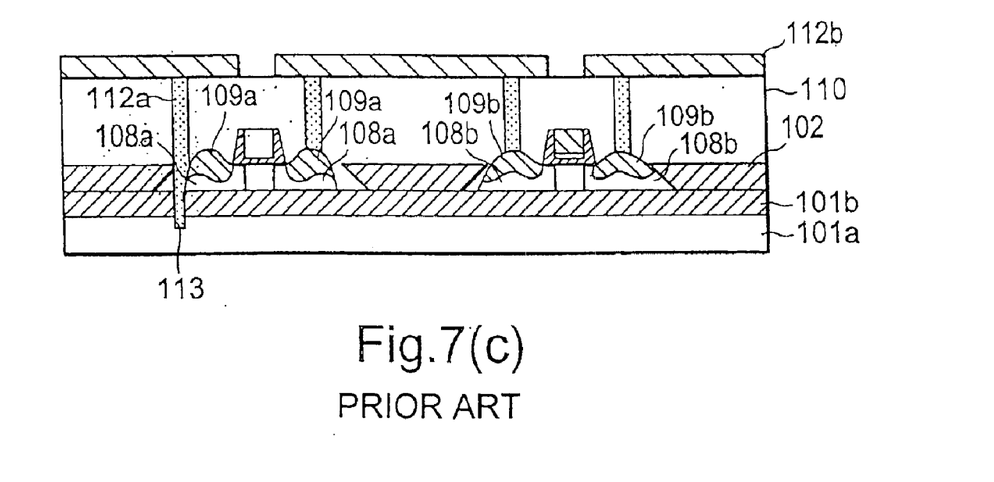

Next, as shown in FIG. 7(c), a contact plug 112a consisting of a metal material is formed in the contact holes 111a and 111b, and a wiring layer 112b connecting the contact plug 112a is formed over the SOI substrate 101. At this time, since the contact plug 112a is also formed in the void 113, the highly doped impurity layer 108a and the silicon substrate 101a are electrically shorted.

The conventional SOI-MOSFET is disclosed in an article of Proceeding 1995 IEEE International SOI Conference, Oct. 1995, pp.116–117, "Characteristics of Submicrometer LOCOS Isolation", published on October, 1995.

SUMMARY OF THE INVENTION

In a method of manufacturing a semiconductor device according to the present invention, a substrate is provided which includes an insulating layer having an upper surface and a silicon layer extending over the upper surface of the insulating layer, a field insulating region is formed in the silicon layer, an impurity region is formed which is surrounded by the field insulating region, a gate electrode is formed over the silicon layer, and the silicon layer is heat treated at a heat treatment temperature that is less than an aggregation temperature of the silicon layer.

According to the present invention, a thermal aggregation of a silicon layer can be inhibited. Therefore, a silicon deficiency of the silicon layer caused by the thermal aggregation of the silicon layer can be inhibited.

The above and further novel features of the invention will more fully apparent from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1A:
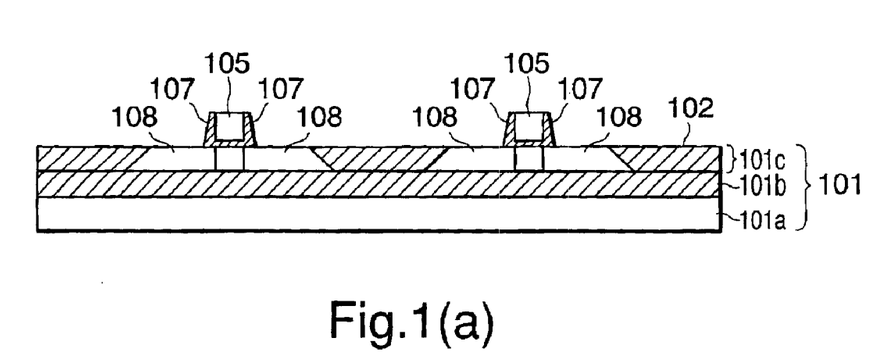
FIGS. 1(a) and 1(b) are cross-sectional views showing a method of manufacturing a semiconductor device according to a first preferred embodiment of the present invention.
Figure 1B:
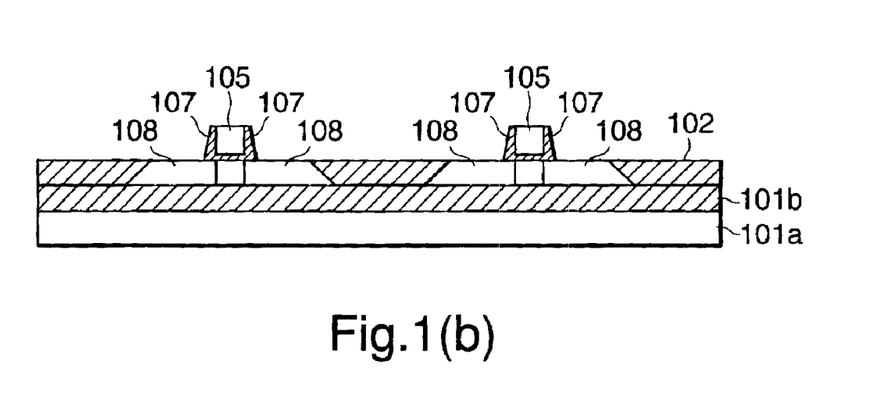

FIGS. 1(a) and 1(b) are cross-sectional views showing a method of manufacturing a semiconductor device according to a first preferred embodiment of the present invention. An SOI substrate 101 includes a silicon substrate 101a, an embedded oxide layer 101b and a thin silicon layer 101c (an SOI layer 101c). As shown in FIG. 1(a), a field oxide region 102 and a highly doped impurity region 108 are formed in the SOI layer 101c, and a gate electrode 105 and a side wall 107 are formed over the SOI substrate 101. The highly doped impurity region 108 is formed by an implantation of impurity ions. Then, a heat treatment is performed to activate the ion-implanted impurities. At this time, it is necessary to understand a start temperature (an aggregation temperature) of the thermal aggregation of the SOI layer 108, so as to inhibit the thermal aggregation of the SOI layer 108.

Figure 2:
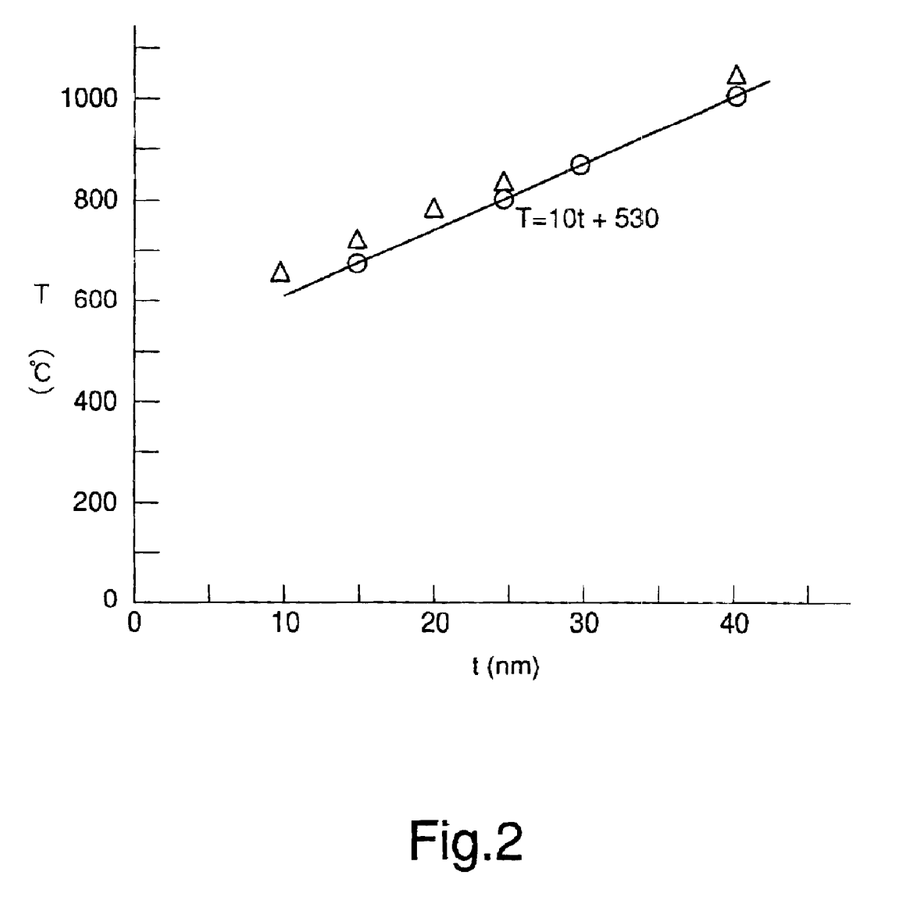
FIG. 2 is an explanatory diagram showing an experimental result of a heat treatment according to the first preferred embodiment of the present invention.

FIG. 2 is an explanatory diagram showing an experimental result of a heat treatment according to the first preferred embodiment of the present invention. In this experiment, the heat treatment is performed for 5 minutes in a hydrogen atmosphere under 266 Pa pressure. FIG. 2 shows a relationship between a temperature (° C.) of the heat treatment (in a vertical axis) and a thickness (nm) of the SOI layer 108 (in a horizontal axis). In particular, an evaluation was made as to whether an aggregation of the SOI layer 108 was generated at each of the various heat treatment temperatures and thicknesses of the SOI layer. In FIG. 2, white triangles indicate that the SOI layer 108 had aggregated, and white circles indicates that the SOI layer 108 had not aggregated.

When the aggregation temperature and the thickness of SOI layer 108 are T and t, respectively, the aggregation temperature T can be represented as a function of the thickness t. Specifically, the relationship between the aggregation temperature T and the thickness t of the SOI layer 108 can be indicated as the following equation (1).

$$T = (10t + 530) \, °C. \quad (1)$$

For example, when the thickness t of the SOI layer 108 is 30 nm, the aggregation temperature T of the SOI layer 108a is 830° C. Also, when the thickness t of the SOI layer 108 is 10 nm, the aggregation temperature T of the SOI layer 108 is 630° C.

In the first preferred embodiment, the heat treatment is performed at a temperature which is less than the aggregation temperature of the SOI layer 108a. Therefore, as shown in FIG. 1(b), the ion-implanted impurities into the SOI layer 108 are activated without the aggregation of the SOI layer 108, due to the heat treatment which is performed at the temperature of less than the aggregation temperature of the SOI layer 108. Specifically, an upper surface of the embedded oxide layer 101b is not exposed as shown in FIG. 6(b) in the prior art.

According to the first preferred embodiment of the present invention, since the heat treatment is performed at a temperature which is less than the aggregation temperature of the SOI layer 108, the aggregation of the SOI layer 108 can be inhibited. Therefore, the method of the first preferred embodiment can inhibit a silicon deficiency of the SOI layer 108.

Figure 3A:
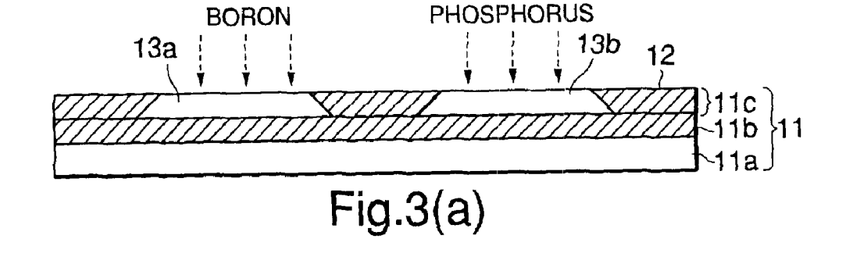
FIGS. 3(a) through 3(e) and 4(a) through 4(c) are cross-sectional views showing a method of manufacturing a semiconductor device according to a second preferred embodiment of the present invention.

FIGS. 3(a) through 3(e) and 4(a) through 4(c) are cross-sectional views showing the method of manufacturing a semiconductor device according to a second preferred embodiment of the present invention. In this embodiment, a method for manufacturing a fully depleted SOI-FET will be described. An SOI substrate 11 includes a silicon substrate 11a, an embedded oxide layer 11b and a thin silicon layer 11c (an SOI layer 11c). As shown in FIG. 3(a), field oxide regions 12 and circuit regions 13a and 13b are formed over the SOI substrate 11 using a LOCOS process. An N type impurity ion (e.g., Boron) is implanted into the circuit region 13a, and a P type impurity ion (e.g., Phosphorus) is implanted into the circuit region 13b. Then, a heat treatment is performed to activate the impurity ions (Boron and Phosphorus).

Figure 3B:
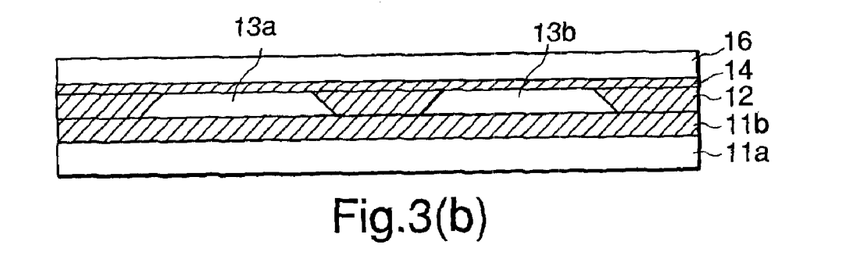

Next, as shown in FIG. 3(b), an oxide layer 14 is formed over the SOI substrate 11 using an electric furnace, and a poly-silicon layer 16 is formed on the oxide layer 14 using a CVD apparatus.

Figure 3C:
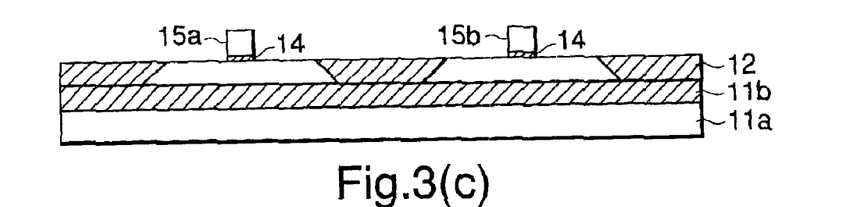

Next, as shown in FIG. 3(c), gate electrodes 15a and 15b are formed using a photolithography process and an anisotropic etching of the poly-silicon layer 16 using a dry etching process (e.g., RIE: reactive ion etching).

Figure 3D:
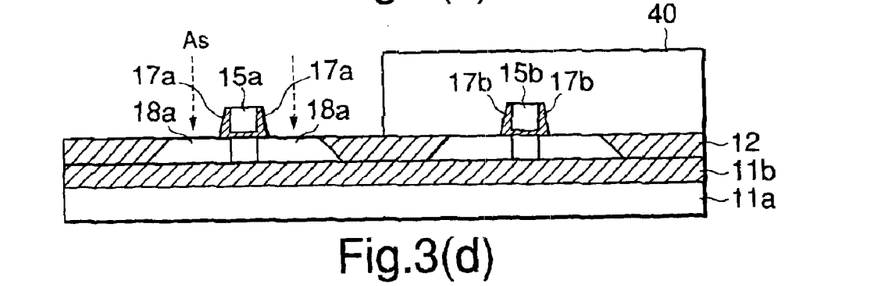

Next, as shown in FIG. 3(d), side walls 17a and 17b consisting of an insulating material (e.g., silicon oxide ($SiO_2$) or silicon nitride ($SiN_4$)) are formed using the CVD process and the anisotropic etching. Then, an As ion is implanted into a source-drain region of the circuit region 13a, after a resist layer 40 is formed over the circuit region 13b having the gate electrode 15b. As a result, a highly doped impurity layer 18a is obtained. Then, the resist layer 40 is removed.

Figure 3E:
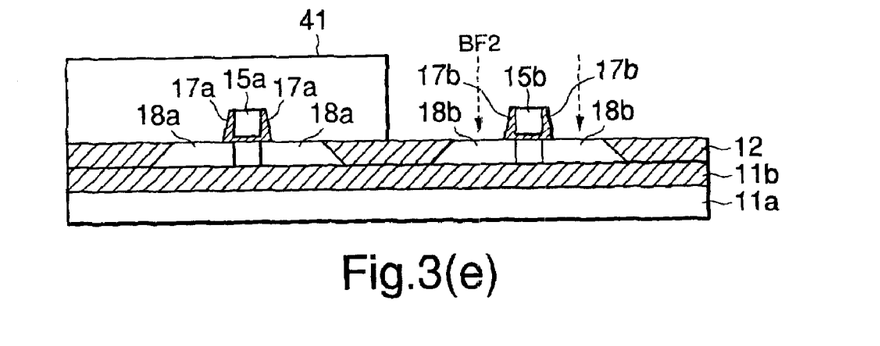

Next, as shown in FIG. 3(e), a $BF_2$ ion is implanted into a source-drain region of the circuit region 13b, after a resist layer 41 is formed over the circuit region 13b having the gate electrode 15b. As a result, a highly doped impurity layer 18b is obtained. Then, the resist layer 41 is removed.

As a general observation, a thin chemical oxide layer may be formed on the SOI layer when a cleaning process of the SOI substrate is performed before the heat treatment process. However, since such a thin chemical oxide layer is deoxidized at a temperature of more than 800° C. due to a silicon (Si), and then sublimes as a silicon oxide ($SiO_2$), a clean upper surface of the SOI layer is exposed. Such a deoxidization of the thin chemical oxide layer is disclosed in the magazine article of the JAPANESE JOURNAL OF APPLIED PHYSICS, VOL. 29, NO. 6, JUNE, 1990, pp. 1004–1008, "Thermal Desorption from Si (111) Surfaces with Native Oxide Formed During Chemical Treatments".

Figure 4A:
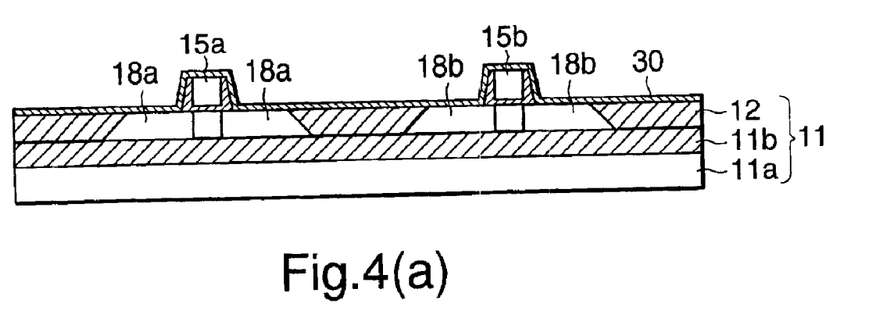

Therefore, in the second preferred embodiment, as shown in FIG. 4(a), a protection layer 30 (e.g., silicon oxide ($SiO_2$) or silicon nitride ($SiN_4$)) is formed over the SOI substrate 11. At this time, a thickness of the protection layer 30 is equal to or more than 1 nm. Then, a heat treatment is performed to activate the ion-implanted impurities at a temperature of 1000° C. in a nitride atmosphere using a rapid thermal anneal (RTA). At this time, since upper surfaces of the highly doped impurity layers 18a and 18b which are the SOI layer are covered and protected by the protection layer 30, the highly doped impurity layers 18a and 18b which are the SOI layer do not aggregate. Therefore, an upper surface of the embedded oxide layer 11 b locating at the circuit regions 13a and 13b does not exposes.

Figure 4B:
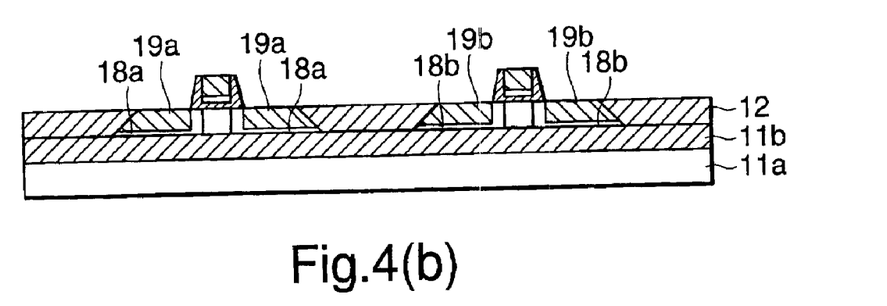

Next, as shown in FIG. 4(b), refractory metal silicide layers 19a and 19b are formed in the highly doped impurity layers 18a and 18b, respectively, by a silicide process after the protection layer 30 is removed.

Figure 4C:
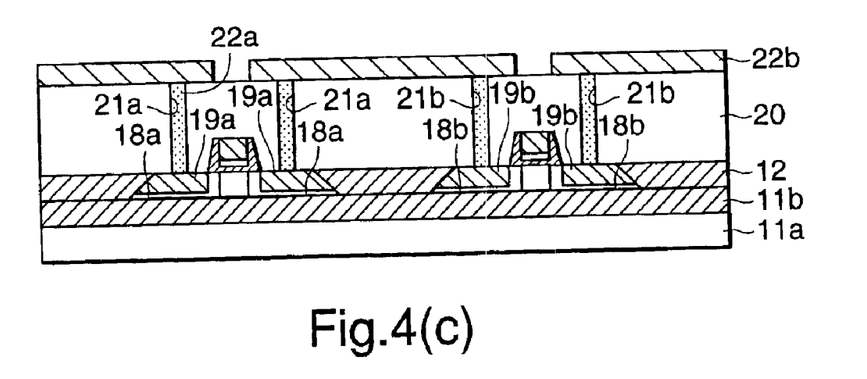

Next, as shown in FIG. 4(c), an interlayer insulating layer 20 is formed over the SOI substrate 11 by a CVD process. Then, contact holes 21a and 21b are formed in the interlayer insulating layer 20, by an anisotropic etching of the interlayer insulating layer 20 using a dry etching process (e.g., RIE: reactive ion etching). Then, a contact plug 22a consisting of a refractory metal material (e.g., tungsten (W)) is formed in the contact holes 21a and 21b, and a wiring layer 22b connecting the contact plug is formed over the SOI substrate 11.

According to the second preferred embodiment of the present invention, since the protection layer 30 is formed over upper surfaces of the highly doped impurity layers 18a and 18b which are the SOI layer, before the heat treatment which activates the ion-implanted impurities is preformed, the aggregation of the SOI layer 108 can be inhibited. Therefore, the method of the first preferred embodiment can inhibit a silicon deficiency of the SOI layer 108. Further, since the heat treatment can be performed at a high temperature, a crystal deficiency remaining to the highly doped impurity layers 18a and 18b can be effectively recovered. Therefore, the second preferred embodiment can form the SOI-FET having small parasitic leakage.

While the second preferred embodiment of the present invention presents an example in which the protection layer is formed before the heat treatment is performed, the invention is not limited to this, and may instead be formed in the early heat treatment stages before a temperature of the heat treatment reaches the aggregation temperature of the SOI layer. Further, a thermal oxide layer which has a thickness which is equal to or more than 1 nm may be formed over the upper surface of the SOI layer as a protection layer, by introducing a particle of oxide gas in the early heat treatment stage. As a result, since the protection layer is formed during the heat treatment process, a total manufacturing time can be shortened.

FIGS. 5(a) through 5(e) are cross-sectional views showing a method of manufacturing a semiconductor device according to a third preferred embodiment of the present invention. The third preferred embodiment will be described as an example of a method of manufacturing of a semiconductor device such that an the SOI-FET and a single-electron memory (the quantum effect device) are simultaneously formed over an SOI substrate.

Figure 5A:
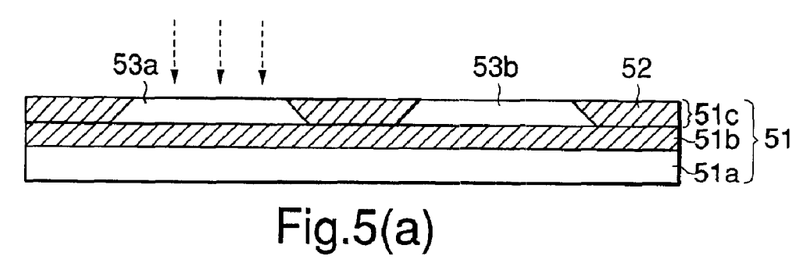
FIGS. 5(a) through 5(e) are cross-sectional views showing a method of manufacturing a semiconductor device according to a third preferred embodiment of the present invention.

An SOI substrate 51 includes a silicon substrate 51a, an embedded oxide region 51b and a thin silicon layer 51c (an SOI layer 11c). As shown in FIG. 5(a), field oxide regions 52 and circuit regions 53a and 53b are formed over the SOI substrate 51 using a LOCOS process. At this time, the SOI-FET is formed in the circuit region 53a, and the single-electron memory is formed in the circuit region 53b. Then, after a resist pattern is formed on the circuit region 53b, an N type impurity ion (e.g., Boron) is implanted into the circuit region 53a, or a P type impurity ion (e.g., Phosphorus) is implanted into the circuit region 53a, depending on the conductive type of the SOI-FET. Then, a heat treatment is performed to activate the impurity ion (Boron or Phosphorus).

Figure 5B:
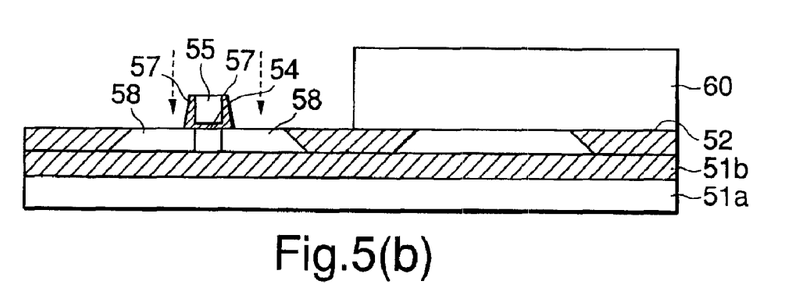

Next, as shown in FIG. 5(b), similar to the second preferred embodiment, an oxide region 54, a gate electrode 55 and a side wall 57 are formed in the circuit region 53a. The oxide region 54 is formed using an electric furnace. The gate electrode 55 which may be a poly-silicon, for example, is formed using a CVD process and an anisotropic etching (e.g., RIE: reactive ion etching). The side wall 57 consisting of an insulating material (e.g., silicon oxide ($SiO_2$) or silicon nitride ($SiN_4$)) is formed using the CVD process and the anisotropic etching. Then, as shown in FIG. 5(b), impurity ion is implanted into the source-drain region (the circuit region 53a) to form a highly doped impurity layer 58, using the resist layer 60 as a mask.

Figure 5C:
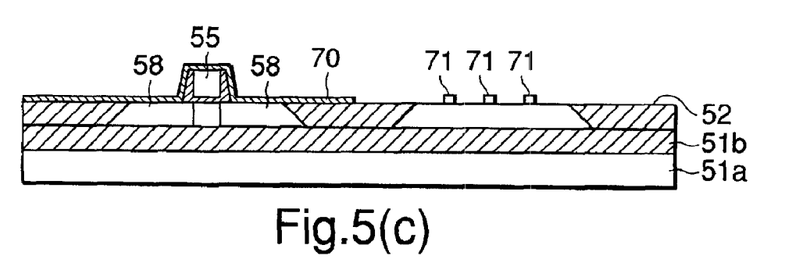

Next, an insulating layer which may be a silicon oxide ($SiO_2$) or a silicon nitride ($SiN_4$), for example, is formed over of the SOI substrate 51 which includes both circuit regions 53a and 53b, after the resist layer 60 is removed. A thickness of the insulating layer is more than 1 nm. Then, as shown in FIG. 5(c), a protection layer 70 is formed in the circuit region 53a, and a plurality of insulating patterns 71 are formed in the circuit region 53b, due to a patterning of the insulating layer by an etching.

Figure 5D:
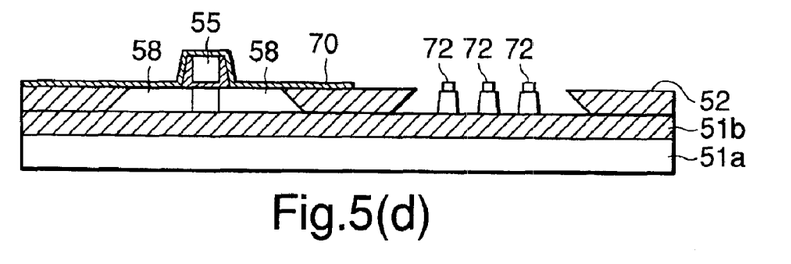

Next, a heat treatment is performed to activate the ion-implanted impurities at a temperature of more than 800° C. in a nitride atmosphere using a rapid thermal anneal (RTA). As a result, as shown in FIG. 5(d), a plurality of quantum dots 72 which have a silicon island structure are formed in the circuit region 53b, due to a thermal aggregation of the SOI layer 51b of the circuit region 53b. However, since the SOI layer 51b of the circuit region 53a is protected from the high temperature of the heat treatment by the protection layer 70, the SOI layer 51b of the circuit region 53a does not aggregate.

Figure 5E:
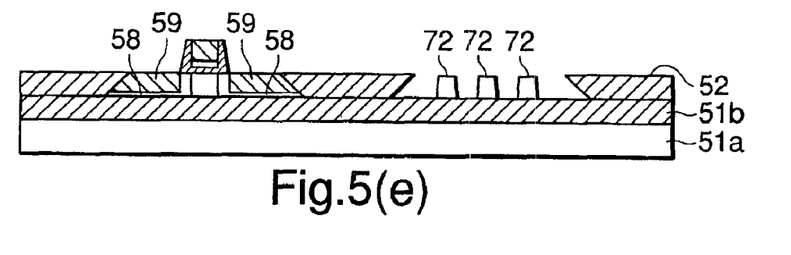

Next, as shown in FIG. 5(e), a refractory metal silicide layer 59 is formed in the highly doped impurity layer 58 by a silicide process after the protect layer 70 and the plurality of insulating patterns 71 are removed. The subsequent processes of the manufacturing method of the third preferred embodiment are the same of the second preferred embodiment.

According to the third preferred embodiment of the present invention, since the heat treatment is performed after the circuit region 53a of the semiconductor substrate 51 is covered by the protection layer 70 and the plurality of insulating patterns 71 are formed in the circuit region 53b, the thermal aggregation of the SOI layer 51c of the circuit region 53a can be inhibited, and that of the circuit region 53b can be selectively aggregated. As a result, the plurality of the quantum dots 72 which have a silicon island structure can be formed in the circuit region 53b using the thermal aggregation of the SOI layer 51c. Therefore, the third preferred embodiment can integrate the SOI-FET and the single-electron memory (the quantum effect device) in the one semiconductor chip.

While the third preferred embodiment of the present invention presents an example in which the SOI-FET and the single-electron memory (the quantum effect device) are formed, simultaneously, the invention is not limited to this example, and the SOI-FET may be formed after the single-electron memory (the quantum effect device) is formed. Since an aggregation temperature of the silicon layer depends on accordance with a thickness of the silicon layer, it is necessary to control the aggregation temperature for each of various thicknesses of the silicon layer. However, in the third preferred embodiment, since the thermal aggregation of the silicon layer is used selectively, it is easy to control such a manufacturing process even where a plurality of circuit regions easy have different thicknesses. Furthermore, the third preferred embodiment can simplify a temperature setting of the manufacturing process even when plural devices require different process settings (e.g., the SOI-FET and the quantum effect device).

Further, the third preferred embodiment may be set such that a thickness of the silicon layer of the circuit region 53b is thinner than that of the circuit region 53a. Therefore, since the aggregation temperature of the silicon layer of the circuit region 53b is the lower, a throughput of the manufacturing process can improve.

Further, a monocrystal silicon layer may be formed in the circuit region 53a as a silicon layer, and an amorphous silicon layer or a poly-silicon layer may be formed in the circuit region 53b as a silicon layer.

Further, while the third preferred embodiment of the present invention presents an example in which the quantum effect device which includes the quantum dots and quantum thin lines is formed in the silicon layer (the SOI layer), the present invention is not limited to this example and the quantum effect device may be formed in a semiconductor layer (e.g., an amorphous germanium layer and a polycrystalline germanium layer) or in a metal layer (e.g., an aluminum layer and a copper layer). The semiconductor layer and the metal layer are aggregated in condition at a temperature which is lower than the thermal aggregation temperature of the silicon layer (the SOI layer). Therefore, since the aggregation temperature at which the quantum effect device is formed is lower, the temperature setting of the manufacturing process step can be simplified.

Further, while the third preferred embodiment of the present invention presents an example in which the heat treatment is performed at a temperature of more than 800° C. in a nitride atmosphere, the present invention is not limited to this example and the heat treatment may be performed at a temperature of more than the thermal aggregation temperature of the silicon layer within a noble gas (e.g., an argon gas) atmosphere as a non-oxidizing atmosphere. As a result, a silicon nitride layer (a deposition layer) which is generated by reacting with the silicon layer (the SOI layer), due to such heat treatment at the high temperature within the nitride atmosphere, is not formed.

Further, the heat treatment may be performed at more than the thermal aggregation temperature of the silicon layer (the SOI layer) in a reducing gas atmosphere (e.g., a hydrogen gas) as a non-oxidizing atmosphere.

Further, the quantum thin line as one of the quantum effect devices may be formed so as to micro fabricate the silicon layer (the SOI layer) in a line pattern. Furthermore, a resonant tunneling device may be formed as one of the quantum effect devices.

Further, while the first thorough third embodiments of the present invention present an example which is used to form the fully depleted SOI-FET, the present invention is not limited to this example, and may be used to form various device structures, for example a double gate type device, and a thin film FET which is formed over an insulating substrate.

As described above, the method of manufacturing the semiconductor device according to the present invention can inhibit the thermal aggregation of the silicon layer (the SOI layer), since the heat treatment is performed at a temperature which is less than the aggregation temperature of the silicon layer (the SOI layer). Furthermore, since the upper surface of the silicon layer (the SOI layer) is covered with the protection layer when the heat treatment is preformed, the aggregation of the silicon layer (the SOI layer) can be inhibited. Therefore, the method of the present invention can inhibit the silicon deficiency of the silicon layer (the SOI layer).

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

What is claimed is:

1. A method of manufacturing a semiconductor device comprising:

providing a substrate which includes an insulating layer having an upper surface and a silicon layer extending over the upper surface of the insulating layer;

forming a field insulating region in the silicon layer;

forming an impurity region, which is surrounded by the field insulating region, in the silicon layer;

forming a gate electrode over the silicon layer; and heat treating the silicon layer at a heat treatment temperature which is less than an aggregation temperature of the silicon layer, wherein T=(10t+530) °C., where T is the aggregation temperature and t is a thickness of the silicon layer.

2. The method of manufacturing the semiconductor device according to claim 1, wherein the heat treating of the silicon layer is performed in a non-oxidizing atmosphere.

3. The method of manufacturing the semiconductor device according to claim 2, wherein the non-oxidizing atmosphere is a noble gas atmosphere.

4. The method of manufacturing the semiconductor device according to claim 2, wherein the non-oxidizing atmosphere is a reducing gas atmosphere.

5. A method of manufacturing a semiconductor device comprising:

providing a substrate which includes an insulating layer having an upper surface and a silicon layer extending over the upper surface of the insulating layer;

forming a field insulating region in the silicon layer;

forming an impurity region in the silicon layer by implanting impurity ions, the impurity region being surrounded by the field insulating region;

forming a gate electrode over the silicon layer; and activating the implanted impurity ions in the impurity region using a heat treatment temperature that is less than an aggregation temperature of the silicon layer; wherein the heat treatment temperature is selected as a function of a thickness of the silicon layer.

6. The method of manufacturing the semiconductor device according to claim 5, wherein said activating is performed in a non-oxidizing atmosphere.

7. The method of manufacturing the semiconductor device according to claim 6, wherein the non-oxidizing atmosphere is a noble gas atmosphere.

8. The method of manufacturing the semiconductor device according to claim 6, wherein the non-oxidizing atmosphere is a reducing gas atmosphere.

* * * * *